United States Patent [19]
Lee et al.

[11] Patent Number: 5,407,992
[45] Date of Patent: Apr. 18, 1995

[54] ION IMPLANTATION METHOD FOR PREPARING POLYMERS HAVING OXYGEN EROSION RESISTANT SURFACES

[75] Inventors: Eal H. Lee, Oak Ridge; Louis K. Mansur, Clinton; Lee Heatherly, Jr., Jacksboro, all of Tenn.

[73] Assignee: Martin Marietta Energy Systems, Inc., Oak Ridge, Tenn.

[21] Appl. No.: 832,169

[22] Filed: Feb. 6, 1992

Related U.S. Application Data

[63] Continuation-in-part of Ser. No. 674,840, Mar. 25, 1991, Pat. No. 5,130,161, which is a continuation of Ser. No. 508,148, Apr. 12, 1990, abandoned.

[51] Int. Cl.$^6$ .............................................. B05D 3/06
[52] U.S. Cl. .................... 427/523; 427/250; 427/525; 524/401
[58] Field of Search ............... 524/401; 427/35, 38, 427/44, 250

[56] References Cited

U.S. PATENT DOCUMENTS

| | | | |
|---|---|---|---|
| 4,377,437 | 3/1983 | Taylor et al. | 156/628 |
| 4,410,611 | 10/1983 | MacIver | 430/5 |
| 4,452,827 | 6/1984 | Kolev et al. | 427/38 |
| 4,526,832 | 7/1985 | Bernett et al. | 428/336 |
| 4,554,208 | 11/1985 | MacIver et al. | 428/332 |
| 4,559,901 | 12/1985 | Morimoto et al. | 118/723 |
| 4,564,583 | 1/1986 | Maeguchi | 430/312 |
| 4,670,064 | 6/1987 | Schachameyer | 148/1.5 |
| 4,743,493 | 5/1988 | Sioshansi et al. | 428/217 |
| 4,751,100 | 6/1988 | Ogawa | 427/38 |
| 4,886,681 | 12/1989 | Clabes et al. | 427/38 |
| 5,130,161 | 7/1992 | Mansur et al. | 427/38 |

OTHER PUBLICATIONS

Hirvonen, J. K., "Surface Modification of Polymers and Ceramics", *Advanced Materials & Processes*, May 1986, 33-36.

J. D. Destefani, Asst. Ed., "Ion Implantation Update," Advanced Mat. & Processes inc. *Metal Progress* Oct. 1988, pp. 39-43.

T. Venkatesan, "High Energy Ion Beam Modification of Polymer Films," Nucl. Inst. & Methods in Phys. Res. B7/8 (1985) 461-467.

J. K. Hirvonen, "Surface Modification of Polymers and Ceramics," Advanced Materials & Processes May 1986, 33-36.

M. B. Lewis, et al., "Triple Ion Beam Irradiation Facility," Nucl. Instruments and Methods in Physics Research B43 (1989) 243-253.

D. C. Ferguson, "Laboratory Degradation of Kapton in a Low Energy Oxygen Ion Beam," NASA Technical Memorandum 83530, Oct. 31, 1983.

V. Srinivasan et al., eds., "Materials Degradation in Low Earth Orbit (LEO)", A publication of TMS, Feb. 17, 1990.

R. C. Tennyson et al. "LDEF Mission Update: Composites in Space," Advanced Materials & Processes (May 1991) 33-36.

A. F. Whittaker, "LDEF Mission Update: Composites in Space," Advanced Materials and Processes (Apr. 1991) 29-32.

*Primary Examiner*—Paul R. Michl
*Assistant Examiner*—U. K. Rajguru
*Attorney, Agent, or Firm*—Joseph A. Marasco; Harold W. Adams

[57] ABSTRACT

Hard surfaced polymers and the method for making them are generally described. Polymers are subjected to simultaneous multiple ion beam bombardment, that results in a hardening of the surface, improved wear resistance, and improved oxygen erosion resistance.

6 Claims, 6 Drawing Sheets

Pristine Kapton

Masked           O-Plasma 1750 nm

Fig. 2

B,N-Implanted

Masked         O-Plasma 270 nm

Fig. 3

Pristine Surface
_____
Fig. 6a
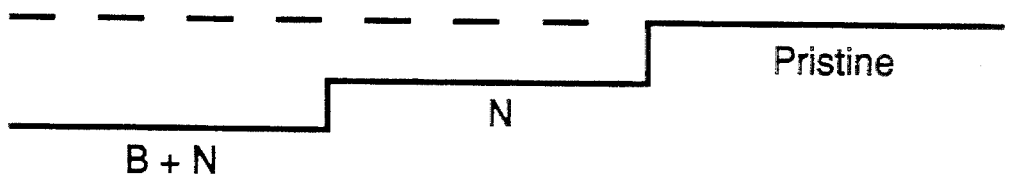
Fig. 6b
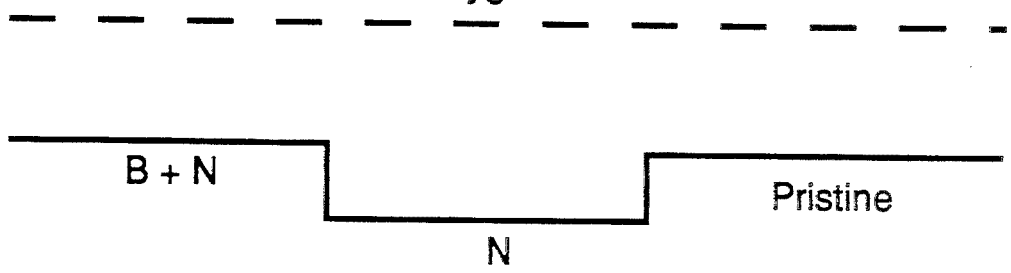
Fig. 6c

ION IMPLANTATION METHOD FOR PREPARING POLYMERS HAVING OXYGEN EROSION RESISTANT SURFACES

The U.S. Government has rights in this invention pursuant to Contract Number DE-AC05-84OR21400 with Martin Marietta Energy Systems, Inc., awarded by the U.S. Department of Energy.

CROSS-REFERENCE TO RELATED APPLICATIONS

This application is a continuation-in-part of application Ser. No. 07/674,840, filed on Mar. 25, 1991, now U.S. Pat. No. 5,130,161, that application being a continuation of application Ser. No. 07/508,148, filed on Apr. 12, 1990, now abandoned.

FIELD OF THE INVENTION

This invention relates to polymers having hard surfaces and particularly to polymers that have been subjected to multiple ion beam bombardment to improve mechanical properties at their surface.

BACKGROUND OF THE INVENTION

Polymers, compositions comprising large organic molecules made from smaller molecules that are linked and cross-linked like chains and nets, are relatively new, having been synthetically produced and commercially developed within the past fifty years. Their many advantages include light weight, moldability, case of forming into intricate configurations, corrosion resistance, versatile electrical properties and low manufacturing cost. These advantages make them suitable for many every day uses such as in our automobiles and kitchens as well as in high-technology industrial and engineering applications. However, inherent softness and tendency to wear away after prolonged use have made polymers impractical materials when hardness and durability are needed.

Attempts have been made to improve the surface characteristics of polymers by use of ion implantation, ion beam irradiation, high performance organic coatings and thin inorganic oxide coatings. Although these treatments have made some polymers more useful, there is a continuing need to develop polymers having hard surfaces that are resistant to wear.

Polymeric materials have been used in spacecraft technology for various applications such as thermal control coatings, insulation, harness materials, structural composites, encapsulants, and flexible substrates in solar arrays having high power-to-weight ratios. However, there has been a great concern regarding the surface degradation of polymeric materials for low-Earth-orbit (LEO) application. Types of degradation include mass loss and changes of materials' mechanical, optical, and electrical properties. The sources of degradation were identified as cosmic radiation, ultraviolet radiation, meteoroids, man-made debris, contamination, vacuum, and atomic oxygen.

In particular, the reactive atmosphere, atomic oxygen which is produced by dissociation of molecular oxygen and water by ultraviolet radiation from the sun, causes a serious adverse effect on polymeric materials. Spacecraft flying with velocities of about 8 km/s at 220 km altitude experience abrasion by particulates such as micrometeroids and space debris impacts and mass loss due to chemical production of volatile oxides through reactions with the high energy atomic oxygen which has the impact energy of 5 eV (equivalent to a temperature 60,000 K.). Efforts have been undertaken by others to increase barrier properties by means of surface coatings or laminations as in the use of aluminized tape.

For further information, see D. C. Ferguson, Laboratory Degradation of Kapton in a Low Energy Oxygen Ion Beam, *NASA Technical Memorandum* 83530, 1983; V. Srinivasan, et al., Editors, *Materials Degradation in Low Earth Orbit (LEO)*, particularly pages 97–105, published 1990 by The Minerals, Metals, & Materials Society, Warrendale, Pa.; A. F. Whitaker, Coatings could protect composites from hostile space environment, *Advanced Materials & Processes*, April, 1991; and, R. C. Tennyson, et al., Designers must account for dimensional changes in composites due to outgassing, *Advanced Materials & Processes*, May, 1991. It is evident from these and other studies that an important need exists for polymers having hard surfaces that are resistant to oxygen erosion.

SUMMARY OF THE INVENTION

In view of the above needs, it is an object of this invention to provide a polymer having a hardened surface.

It is another object of this invention to provide a polymer that can be used in abrasive environments for a long period of time.

A further object of this invention is to provide a polymer having added linking elements at the surface.

Another object of the invention is to provide a polymer having artificially introduced alloying elements at the surface.

It is another object of this invention to provide a polymer having hard particle formation at the surface comprising added elements.

An additional object of the invention is to provide a process for making a polymer having a hard surface that will withstand wear under harsh conditions for a prolonged period of time.

It is another object of this invention to provide a polymer having a hard surface that is resistant to oxygen erosion.

It is a further object of this invention to provide a polymer suitable for use in space applications.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the composition of this invention may comprise a polymer that has embedded within its surface hard compounds (particulate formations) that are formed when alloying elements are introduced by ion beam bombardment and react with either the elements of the polymer or with each other. These alloying elements may also increase hardness by causing the chemical crosslinking of the polymer during bombardment. The invention may also comprise a process for making hard surface polymers comprising bombarding the surface of a polymer with multiple ions of elements that when reacted with the elements of the polymer will form a compound (particulate formation) that is hard. The composition has improved hardness, wear resistance, and oxygen erosion resistance at the surface that broadens the scope of applications of these materials.

BRIEF DESCRIPTION OF THE DRAWINGS

FIG. 2 is a photograph showing the oxygen erosion of pristine Kapton.

FIG. 3 is a photograph showing the oxygen erosion resistance of Kapton which has been ion implanted in accordance with the present invention.

FIG. 6 is a series of schematic representations illustrating step-heights of successive horizontal cross sectional views of the material shown in FIGS. 4 and 5. FIG. 6a represents pristine Kapton. FIG. 6b represents relative step-heights produced on Kapton by single ion implantation and dual ion implantation in accordance with the present invention. FIG. 6c represents relative step-heights produced by oxygen plasma treatment of the Kapton of FIG. 4, demonstrating greater resistance of dual-beam treated area to oxygen erosion compared to that of single ion implantation and pristine Kapton.

DETAILED DESCRIPTION OF THE PREFERRED EMBODIMENT

Figure 1:
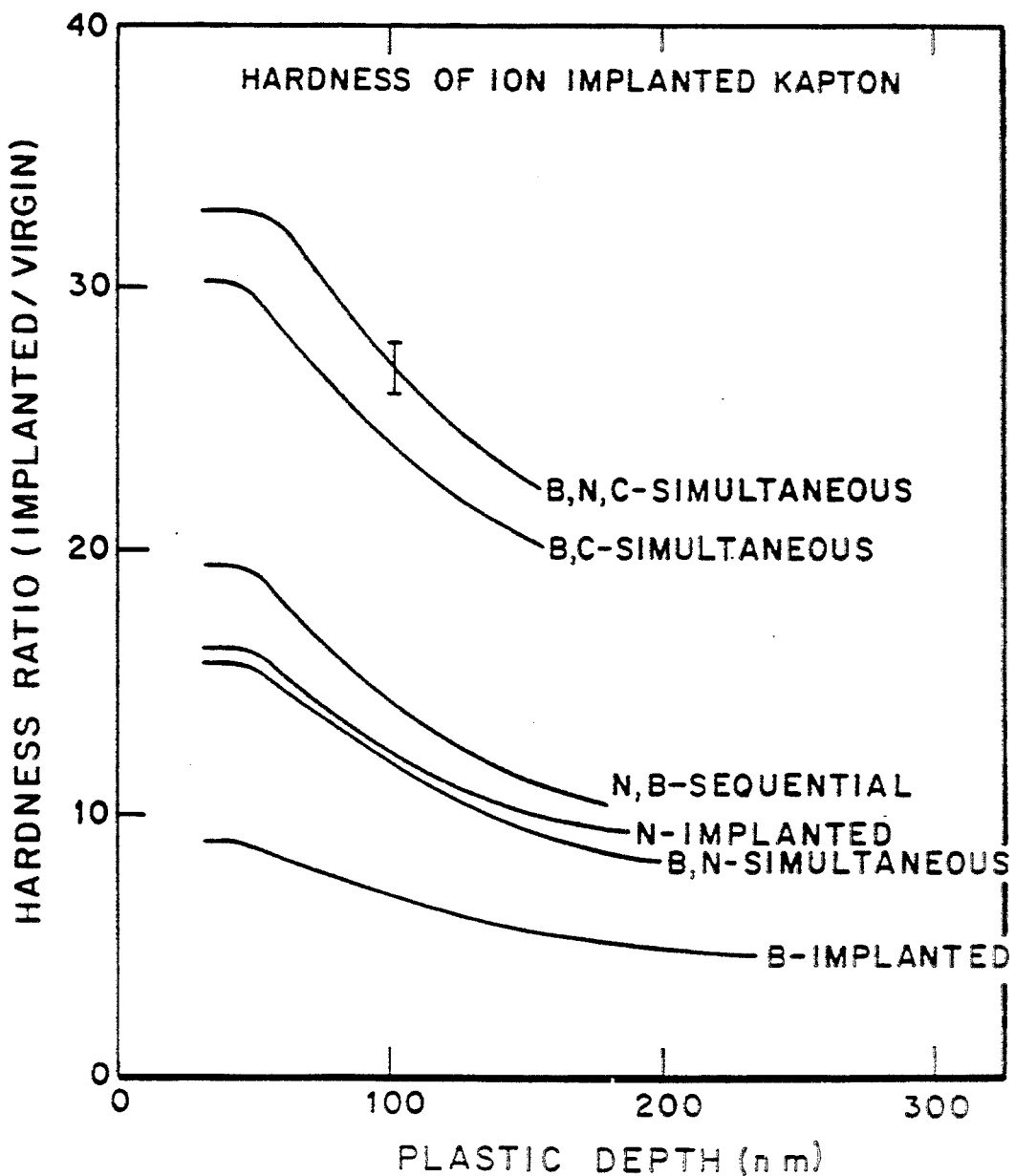
FIG. 1 shows hardness test results of implanted and unimplanted Kapton polyimide as a function of depth.

Ion beam modification of materials has been the subject of intensive research in many laboratories. Most of the work has involved doping in semiconductors or improving metals and ceramics, while much less attention has been paid to organic molecular solids and polymeric materials. Studies of ion implantation of these materials relate primarily to changes in electrical or optical properties with less emphasis on physical or chemical properties. Studies of mechanical property changes have even been more neglected, despite the fact that the utilization of polymers could be expanded greatly if significant improvement could be made in surface mechanical properties.

The composition of this invention employs ion beam implantation of polymers to harden the surface. Various elements were used as the ion beam source and various polymers were used as the surface. It was found that polymer surfaces were generally hardened by ion beam bombardment and that bombardment by multiple ion beams exhibited significant improvements over single beam implantation.

In conventional studies of ion beam bombardment chemical crosslinking was thought to be the main hardening mechanism. This application discloses two new mechanisms that operate when a polymer surface is bombarded with multiple beams simultaneously; first, the addition of a bond-forming element and second, hard particle formation.

It is believed that any polymer will exhibit surface hardening when subjected to this process. A preferred polymer is one that does not soften upon ion implantation, such as a high temperature polymer. Examples of polymers are Kapton, the trade name for polypyromellitimide polyimide, Tefzel, the trade name for tetrafluoroethylene/ethylene copolymer, and PET the trade name for polyethylene terephthalate, all sold by the DuPont Company of Wilmington, Del. Other examples are PEEK, the trade name for poly(ether-ether-ketone) manufactured by Westlake Plastic Company of Lenni, Pa., and Lexan, the trade name for polycarbonate manufactured by General Electric Company of Pittsfield, Mass.

The elements selected for the ion source are broadly those that will form hard compounds with elements of the polymer or with other bombarding elements. For instance silicon, zirconium and tungsten are good ion sources since they form hard compounds with carbon, the primary element of the polymer composite. Nitrogen is also good since it forms hard compounds with elements such as boron and carbon. If these ions are bombarded simultaneously at a surface then the added hardening mechanism of particulate formation operates to improve the mechanical properties of the surface beyond that which is possible when the bombardment is successive. Other ions that will cause a hardening effect are those that react to form carbides, silicides, oxides and nitrides, provided they are bombarded simultaneously with carbon, silicon, oxygen and nitrogen, respectively.

Other elements that have a hardening effect are those that allow additional crosslinking of the polymer. These are generally those elements that are multivalent, thus having multiple bonding sites available to form additional linkages. Examples are C, Fe, B, Cr, V, Ti, Hf and S. Of those, V, Ti and Hf are also carbide forming, therefore they possess two hardening mechanisms.

The composition and process described is intended to be illustrative and not in any way a limitation on the scope of the invention. Persons of ordinary skill in the art should be able to envision variations on the general principle of this invention that fall within the scope of the claims.

To perform this bombarding process, it is necessary to have a means for accelerating more than one ion beam at a time, such as the Triple Ion Irradiation Laboratory at Oak Ridge National Laboratory (ORNL) in Oak Ridge, Tenn. To penetrate the surface to a desired depth, the bombarding ion beams are accelerated to a sufficient energy level that can be determined by a person of ordinary skill in the art. A skilled person can also tailor the concentrations of the ions as desired.

EXAMPLE I

Kapton, Teflon, Tefzel and PET were implanted with various ions using the triple ion accelerator facility at ORNL. The table shows the results, comparing data for UV-crosslinked polymer, a conventional treatment in the industry, and an implanted metallic alloy, Fe—Cr—Ni stainless steel. The superior hardness of certain implanted surfaces is evident from the data.

TABLE I

| HARDNESS OF POLYMER AT 100 nm DEPTH | | | | |
|---|---|---|---|---|
| | | Energy | Hardness (GPa) | | Improvement |
| Polymer | Ions | (MeV) | Virgin | Implanted | (times) |
| Kapton | B+ | 0.2 | 0.42 | 3 | 7 |
| | N+ | 0.3 | 0.42 | 5.3 | 13 |
| | N/B | 0.3/0.2 | 0.42 | 5.9 | 14 |

TABLE I-continued

HARDNESS OF POLYMER AT 100 nm DEPTH

| Polymer | Ions | Energy (MeV) | Hardness (GPa) Virgin | Hardness (GPa) Implanted | Improvement (times) |
|---|---|---|---|---|---|
| | B,N | 0.2/0.3 | 0.42 | 5 | 12 |
| | B,C | 0.4/0.6 | 0.42 | 10 | 24 |
| | B,C,N | 0.4/0.6/0.7 | 0.42 | 11 | 26 |
| | Fe$^{++}$ | 2 | 0.42 | 7.5 | 18 |
| | He | 0.2 | 0.42 | 1.2 | 2.5 |
| | DLC-Coating | | 0.42 | 0.6 | 1.5 |
| Teflon | B$^+$ | 0.2 | 0.2 | 0.4 | 2 |
| | N$^+$ | 0.3 | 0.2 | 0.1–0.7 | 0.5–3.5 |
| | B,N | 0.2/0.3 | 0.2 | 0.3–0.6 | 1.5–3 |
| | Fe$^{++}$ | 2 | 0.2 | 0.3 | 1.5 |
| Tefzel | Fe$^{++}$ | 1 | 0.15 | 3.1 | 20 |
| PET | Fe$^{++}$ | 1 | 0.42 | 5 | 12 |
| PG 901WC | UV | — | | 0.68 | — |
| (Fe—Cr—Ni) | B,C,N. | 0.4/0.6/0.7 | 3 | 6.3 | 2 |
| | W$_2$C | e-beam evap | 3 | 4.5 | 1.5 |

It is clear that the polymers exhibit surface improvement after bombardment and Kapton shows significant surface hardening when subjected to multiple ion bombardment.

EXAMPLE II

Kapton polyimide film was implanted with 0.4 MeV boron, 0.7 MeV nitrogen, and 0.6 MeV carbon. The implanted surface exhibited substantial improvements in surface smoothness, hardness and wear resistance. Implanted specimens showed over thirty times greater hardness for simultaneous triple beam implantation and over ten times larger hardness for single (boron) and dual (boron, nitrogen) beam implantation compared with unimplanted material as shown in FIG. 1. Actually, the hardness may be underestimated due to the softness of untreated material lying beyond the ion beam range. Wear properties were characterized after 10,000 reciprocating cycles using a nylon ball or high carbon 52100 steel ball with one Newton normal force. Severe wear tracks were observed in virgin Kapton, but no appreciable wear was observed in ion implanted Kapton.

This invention provides a new class of polymers that have been subjected to multiple ion beam implantation. In addition to the simultaneous bombardment process, the invention provides a sequential implantation process without breaking the vacuum that is present during bombardment. It not only allows direct compound formation among implanted ion species as well as with the host polymer structural components, it also causes new bond formation between existing polymer chains, a form of alloying. Operators can tailor hard particle precipitates such as carbides, nitrides, silicides, oxides, hydrides and other compounds using this technique. The process may find further use by providing for the introduction of solid lubricants such as $MoS_2$, $MoSe_2$, $ZrO_2$, PbO, CdO, BN, $NbSe_2$, SbS, $PbI_2$, $CdI_2$, $BI_2$ and $AgI_2$ to the surface of polymers. These applications are made possible by the synergistic effects of multiple ion borons on polymers in alloying, chemical crosslinking, precipitation and catalytic properties. As an example of catalytic properties, Pt/activated-carbon catalysts have been prepared by a chemical process, the reduction of chloroplatinic acid ($H_2PtCl_6$) by borohydride ($NaBH_4$). Ion implantation can provide a means for preparing more versatile and flexible catalysts by providing various combinations of catalytic agent/medium system, for example, as Fe, Ni, Pt and Pd implanted into various polymer fibers or films.

Other polymers which have been tested and exhibit widely varying degrees of improved hardness and wear resistance include: Kynar, a trade name for polyvinylidene fluoride, Ultem, a trade name for polyetherimide, and PES, a chemical designation for polyethersulfone, all available from Westlake Plastics Company, Lenni, Pa.; Vespel a polymer available from Du Pont Company, Wilmington, Del.; PBI, a chemical designation for polybenzimidazoles, available from Hoechst Celanese Corp., Charlotte, N.C.; and, PS (polystyrene), PE (polyethylene), and PP (polypropylene), all available from Goodfellow, Malvern, Pa.

EXAMPLE III

Various polymers were implanted with ions as described in Example I. The varying implantation parameters and hardness results are shown in Table II below.

TABLE II

Hardness Data of Ion Beam Treated Polymers

| Polymer | Ions | Energy* (MeV) | Hardness (GPa) at 100 nm Depth** Virgin | Hardness (GPa) at 100 nm Depth** Implanted | Improvement (times) |
|---|---|---|---|---|---|
| Tefzel | C | .64 | 0.15 | 8.2 | 55 |
| | Ar | 1.00 | 0.15 | 8.2 | 55 |
| | Si | .20 | 0.15 | 0.5 | 3.3 |
| | Zr | 1.50 | 0.15 | 6.5 | 43 |
| Mylar | C | .64 | 0.42 | 14 | 33 |
| | Ar | 1.00 | 0.42 | 15 | 36 |
| Kapton | C | .64 | 0.42 | 6.6 | 16 |
| | Ar | 1.00 | 0.42 | 11 | 26 |
| | Si | .20 | 0.42 | 1.6 | 3.8 |
| PEEK | C | .64 | 0.31 | 8.3 | 27 |
| | B | .20 | 0.31 | 3.5 | 11 |
| | Si | .20 | 0.31 | 1.6 | 5.2 |
| Kynar | C | .64 | 0.30 | 5.5 | 18 |
| Ultem | C | .64 | 0.59 | 8.1 | 14 |
| | B | .20 | 0.59 | 3.4 | 6 |
| Lexan | Ar | 1.00 | 0.32 | 11 | 34 |
| | B,N | .40/.55 | 0.32 | 7.5 | 23 |
| | B | .10 | 0.32 | 1.3 | 4 |
| | B | .20 | 0.32 | 3.2 | 10 |
| | Zr | 1.50 | 0.32 | 3.1 | 9.7 |
| Vespel | Ar | 1.00 | 0.46 | 5.3 | 12 |
| PBI | Ar | 1.00 | 0.92 | 12.7 | 14 |
| PS | B | .10 | 0.37 | 1.75 | 4.7 |
| | B | .20 | 0.37 | 2.3 | 6.2 |
| | Ar | .20 | 0.37 | 1.8 | 4.9 |
| | Ar | .50 | 0.37 | 7.0 | 19 |
| | Ar | 1.00 | 0.37 | 12 | 32 |
| PES | B | .20 | 0.37 | 2.48 | 6.7 |
| PE | B | .20 | 0.074 | 1.58 | 21 |
| PP | B | .20 | 0.14 | 2.6 | 18 |

*Note that high energy is generally more effective for hardness improvement.
**Hardness was measured for specimens implanted to doses between 0.1 and 0.2 atomic percent ions, generally the hardness can be increased further by increasing ion dose.

Furthermore, oxidation erosion rates are reduced drastically by ion-beam treatment according to the present invention. Oxidation erosion resistant polymer surfaces are produced by the disclosed method. Both the hardness and oxidation resistance contribute to the erosion resistance.

Metallic and non-metallic elements such as B, N, C, Ar, Fe, and Zr can employed singly or simultaneously on various polymeric materials, such as Kapton, Tefzel and Mylar, with ion energies ranging from about 0.2 MeV to about 2 MeV. Erosion experiments were carried out by oxygen plasma etching at about 200 watts and about 1 torr pressure using an oxygen asher, International Plasma Corp. RF Generator PM 118 Oxygen Asher. The degree of atomic oxygen erosion resistance depended upon implanted ion species as well as polymer type, as will be seen below.

EXAMPLE IV

Figure 2:
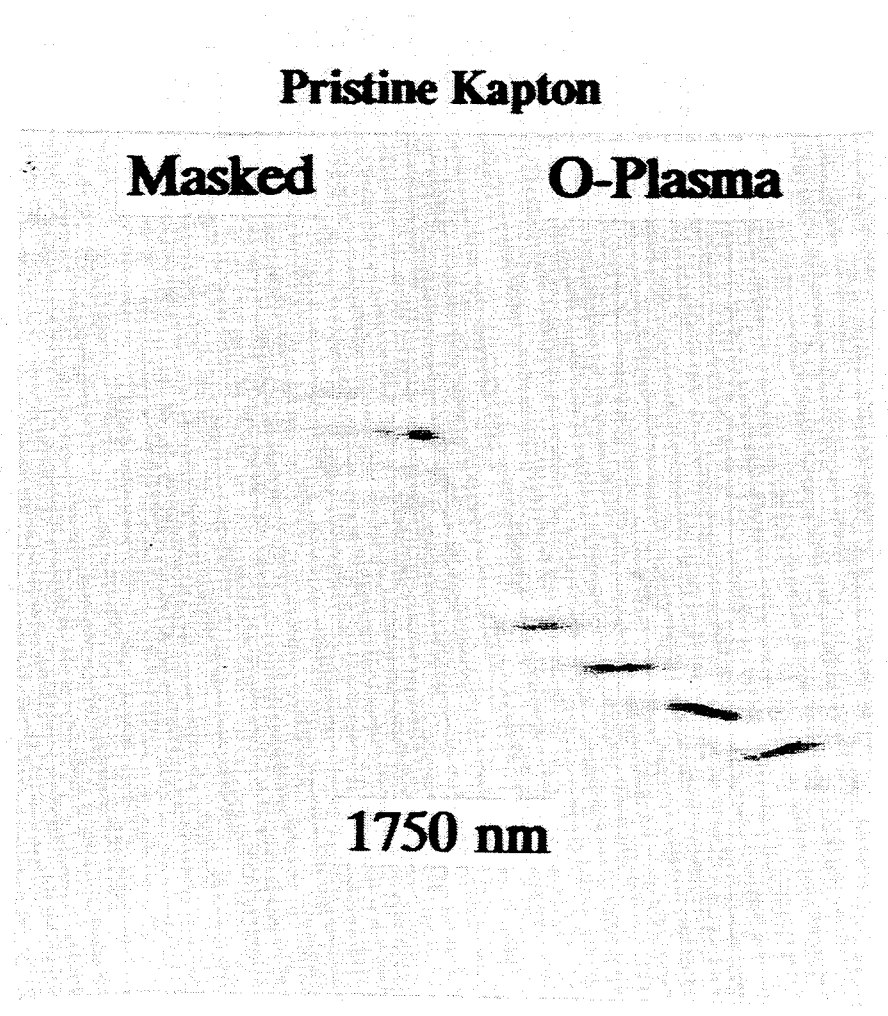
Figure 3:
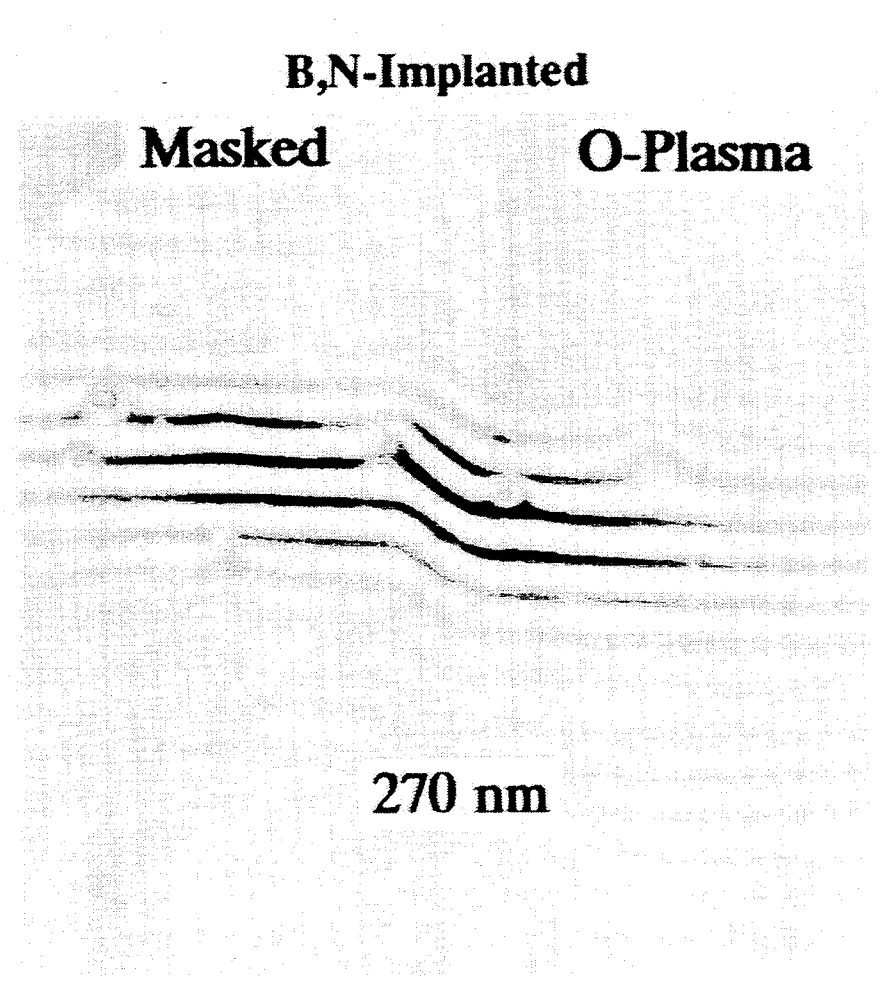

Kapton film was implanted with 200 keV boron and 300 keV nitrogen simultaneously to a dose of $4 \times 10^{15}$ ions/cm$^2$ of each ion species. Ion-beam treated Kapton showed over 6 times less erosion by oxygen plasma than pristine Kapton. Step-height measured between the masked and exposed surface indicated 1750 nm and 270 nm losses of material after 25 minutes exposure to oxygen plasma for pristine and ion-beam treated Kapton respectively. Erosion rates of pristine and B,N,-implanted Kapton were 1.17 and 0.18 nm/s respectively. FIG. 3 is a photograph showing a region of Kapton surface produced by the subject process having over 6 times more oxidation resistance than pristine Kapton, shown in FIG. 2. The photographs illustrate the step heights delineated by the shift of the optical interference fringes.

EXAMPLE V

Figure 4:
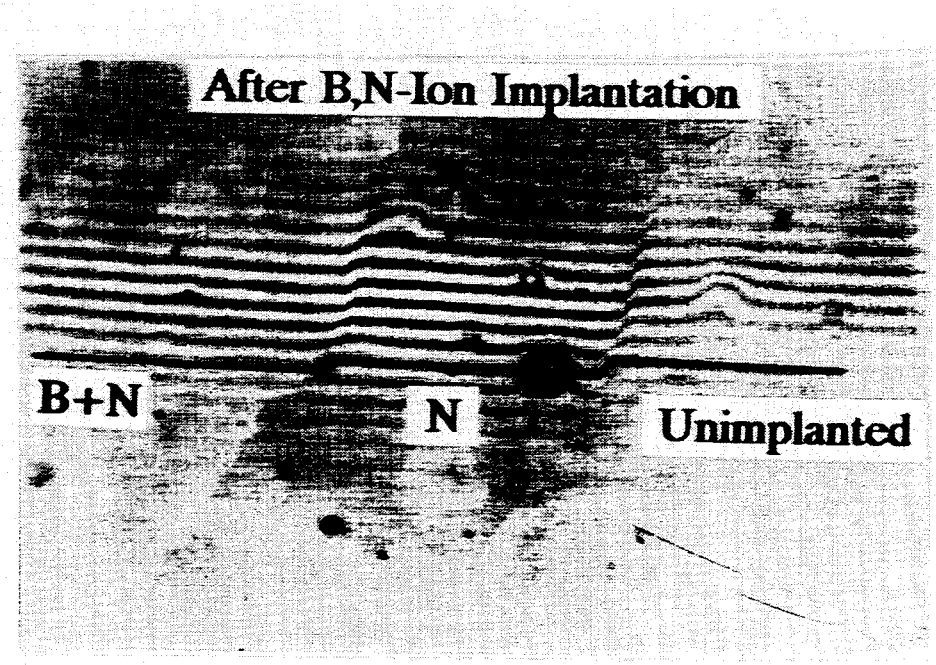
FIG. 4 is a photograph showing relative step-heights produced on Kapton by single ion implantation and dual ion implantation in accordance with the present invention.
Figure 5:
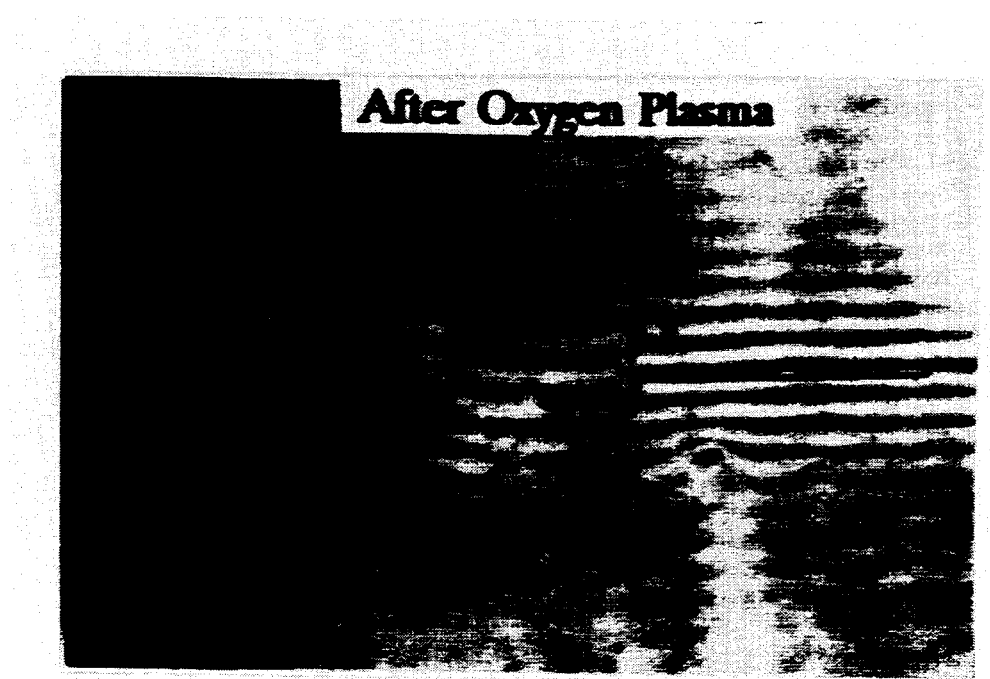
FIG. 5 is a photograph showing relative step-heights produced by oxygen plasma treatment of the Kapton of FIG. 4, demonstrating greater resistance of dual-beam treated area to oxygen erosion compared to that of single ion implantation and pristine Kapton.

Neither single-boron nor single-nitrogen implanted Kapton showed improvement in oxygen erosion resistance, in fact the erosion rate was faster than for pristine Kapton. FIG. 4, 5 and 6 illustrate step height variation of simultaneous B+N-implanted and single N-implanted regions before and after the oxygen plasma treatment. The reversal of step height between the B+N- and N-implanted area clearly indicates that simultaneous implantation improved oxidation resistance but the single N-beam did not. The improvement varied considerably with polymer type and implanted ion species. For example, no significant improvements were observed for 200 keV He/Kapton, 640 keV C/Kapton, 2 MeV Fe/Kapton, 1 MeV Ar/Tefzel, and 1.5 MeV Zr/Tefzel, but some significant improvements were observed for 1 MeV Ar/Kapton, 1 MeV Fe/Mylar, and 1 MeV Fe/Tefzel. Therefore, a reasonable amount of experimentation may be expected in order to ascertain the most preferable treatment parameters for a particular polymer.

The ion beam treatments described herein are not only useful for producing oxygen erosion resistant polymers for space applications, but also for applications needing barriers for oxidation, for example parts exposed to highly corrosive chemicals or oxidizing environments for long periods of time.

While there has been shown and described what are at present considered the preferred embodiments of the invention, it will be obvious to those skilled in the art that various changes and modifications can be made therein without departing from the scope of the inventions defined by the appended claims.

What is claimed is:

1. A process for hardening the surface of a polymer comprising the steps of:
    providing a polymer having a surface; and,
    bombarding said surface of said polymer by simultaneous ion implantation with ions of at least two different elements that when reacted with the elements of said polymer will form a compound having a hardness greater than the hardness of said polymer, the energy level of said ions being at least about 0.2 MeV, to make said surface of said polymer resistant to erosion by atomic oxygen.

2. The process of claim 1 wherein said polymer comprises kapton, and wherein said elements comprise boron and nitrogen.

3. A process for hardening the surface of a polymer comprising the steps of:
    providing a polymer having a surface; and,
    bombarding said surface of said polymer by simultaneous ion implantation with ions of at least two different alloying elements that react together to form a compound having a hardness greater than the hardness of said polymer, the energy level of said ions being at least about 0.2 MeV, to make surface of said polymer resistant to erosion by atomic oxygen.

4. The process of claim 3 wherein said polymer comprises kapton, and wherein said alloying elements comprise boron and nitrogen.

5. A process for hardening the surface of a polymer comprising the steps of:
    providing a polymer having a surface; and,
    bombarding said surface of said polymer by simultaneous ion implantation with ions of at least two different alloying elements that react with the elements of said polymer to effect chemical crosslinking among polymer chains, the energy level of said ions being at least about 0.2 MeV, to make said surface of said polymer resistant to erosion by atomic oxygen.

6. The process of claim 5 wherein said polymer comprises kapton, and wherein said alloying elements comprise boron and nitrogen.

* * * * *